United States Patent
Chang et al.

(10) Patent No.: US 7,123,479 B2
(45) Date of Patent: Oct. 17, 2006

(54) ENHANCED FLOW CHANNEL FOR COMPONENT COOLING IN COMPUTER SYSTEMS

(75) Inventors: Je-Young Chang, San Jose, CA (US); Himanshu Pokharna, San Jose, CA (US)

(73) Assignee: Intel Corporation, Santa Clara, CA (US)

(*) Notice: Subject to any disclaimer, the term of this patent is extended or adjusted under 35 U.S.C. 154(b) by 304 days.

(21) Appl. No.: 10/731,616

(22) Filed: Dec. 8, 2003

(65) Prior Publication Data

US 2005/0122688 A1 Jun. 9, 2005

(51) Int. Cl.
*H05K 7/20* (2006.01)
*F25B 39/02* (2006.01)

(52) U.S. Cl. ............ 361/700; 361/699; 361/701; 361/718; 257/714; 257/715; 165/104.33; 62/515

(58) Field of Classification Search ........ 361/700, 361/699, 701, 717–718, 722; 62/515; 257/714–715; 165/80.4–80.5, 104.33, 185
See application file for complete search history.

(56) References Cited

U.S. PATENT DOCUMENTS

| | | | | |
|---|---|---|---|---|
| 4,129,181 A | * | 12/1978 | Janowski et al. | 165/133 |
| 6,008,988 A | * | 12/1999 | Palmer | 361/704 |
| 6,067,712 A | * | 5/2000 | Randlett et al. | 29/890.053 |
| 6,118,656 A | * | 9/2000 | Wang | 361/687 |
| 6,942,018 B1 | * | 9/2005 | Goodson et al. | 165/80.4 |
| 2003/0062149 A1 | * | 4/2003 | Goodson et al. | 165/104.11 |

* cited by examiner

*Primary Examiner*—Michael Datskovsky
*Assistant Examiner*—Robert J. Hoffberg
(74) *Attorney, Agent, or Firm*—Blakely, Sokoloff, Taylor & Zafman LLP

(57) ABSTRACT

An evaporator having an enhanced flow channel design for use in a computer system is described. Specifically, micro-channels of the evaporator comprise nucleation sites and different channel widths. The enhanced flow channel design improves heat transfer from a computer component to a working fluid.

19 Claims, 11 Drawing Sheets

ENHANCED FLOW CHANNEL FOR COMPONENT COOLING IN COMPUTER SYSTEMS

FIELD OF THE INVENTION

The present invention pertains to the field of computer system design. More particularly, the present invention relates to a thermal management technology for notebook computers.

BACKGROUND OF THE INVENTION

A computer system typically comprises a plurality of electronic components. Such components may include a central processing unit (CPU), a chipset, and a memory. During operation, the components dissipate heat. In addition, voltage stepping inside the computing system also generates heat. If the CPU, or any other electronic component, becomes overheated, performance may suffer and the component's life may be depreciated.

A thermal management system is typically used to remove heat from a computer system. An example of a thermal management system is a two-phase cooling loop. A two-phase cooling loop also uses a pump to circulate a working fluid to cool a component of a system. A two-phase loop typically uses a working fluid such as water. An evaporator or cold plate picks up heat from the component. FIG. 1 depicts a prior art cross-sectional view of an evaporator 120 that picks up heat from a component 110. The evaporator has uniformly spaced micro-channels that provide a path for the heat to travel from the component 110. The heat causes the working fluid to change phase from a liquid to a mixture of liquid and vapor or pure vapor. The working fluid is output from the evaporator to a heat exchanger, condenser, or heat sink. The heat exchanger is typically coupled to a fan that rejects the heat from the working fluid to the ambient air. The vapor condenses in the heat exchanger, converting the working fluid back to liquid. A pump is used to drive the working fluid to the evaporator to complete the loop.

Another example of a thermal management system is a refrigeration loop. Similar to a two-phase cooling loop, a refrigeration loop may comprise a liquid phase and a vapor phase. A refrigeration loop typically uses a working fluid such as Freon to cool a component of a system. An evaporator picks up heat from the component. The heat causes the working fluid to change phase from a liquid to a mixture of liquid and vapor or pure vapor. A pump, working as a compressor, then transports the working fluid to a heat exchanger. The compressor compresses or increases the pressure of the gas, which results in increase in temperature of the fluid. The heat exchanger is typically coupled to a fan that rejects the heat from the working fluid to the ambient air, turning the working fluid back into a liquid. The liquid, however, is still at a high pressure. An expansion valve reduces the pressure of the working fluid and returns the working fluid to the evaporator to complete the loop. The fundamental difference between the refrigeration loop and the two-phase loop is that the heat exchanger in the refrigeration loop typically has a higher temperature than the heat exchanger in the two-phase loop.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

The component cooled by a thermal management system may not have uniform heat distribution across its surface. For example, an evaporator may pick up heat from a CPU die that comprises a core area and a cache area. The core area may consume more power and generate more heat than the cache area.

The higher the heat transfer coefficient, the better heat is dissipated from the component by the thermal management system. Convection heat transfer is defined by the formula:

$$Q = h * A * (T1 - T2),$$

where h is the heat transfer coefficient, A is the heat transfer surface area, T1 is the temperature of the evaporator surface, and T2 is the temperature of the working fluid. Enhanced heat transfer surface structures may increase the pressure drop to increase the heat transfer coefficient.

Heat is transferred from the component to the working fluid by the evaporator. Micro-channels in the evaporator provide a fluid or an air flow path from the component. As discussed above, heat from the component generates vapors in the working fluid. A component, such as a CPU die, that has a temperature gradient across its surface will generate the most vapors over the area in which the component is most hot. The area having a greater amount of vapors may push the working fluid towards other areas. Thus, a component having temperature gradients across its surface area may result in degradation of heat transfer to the working fluid.

Figure 1:
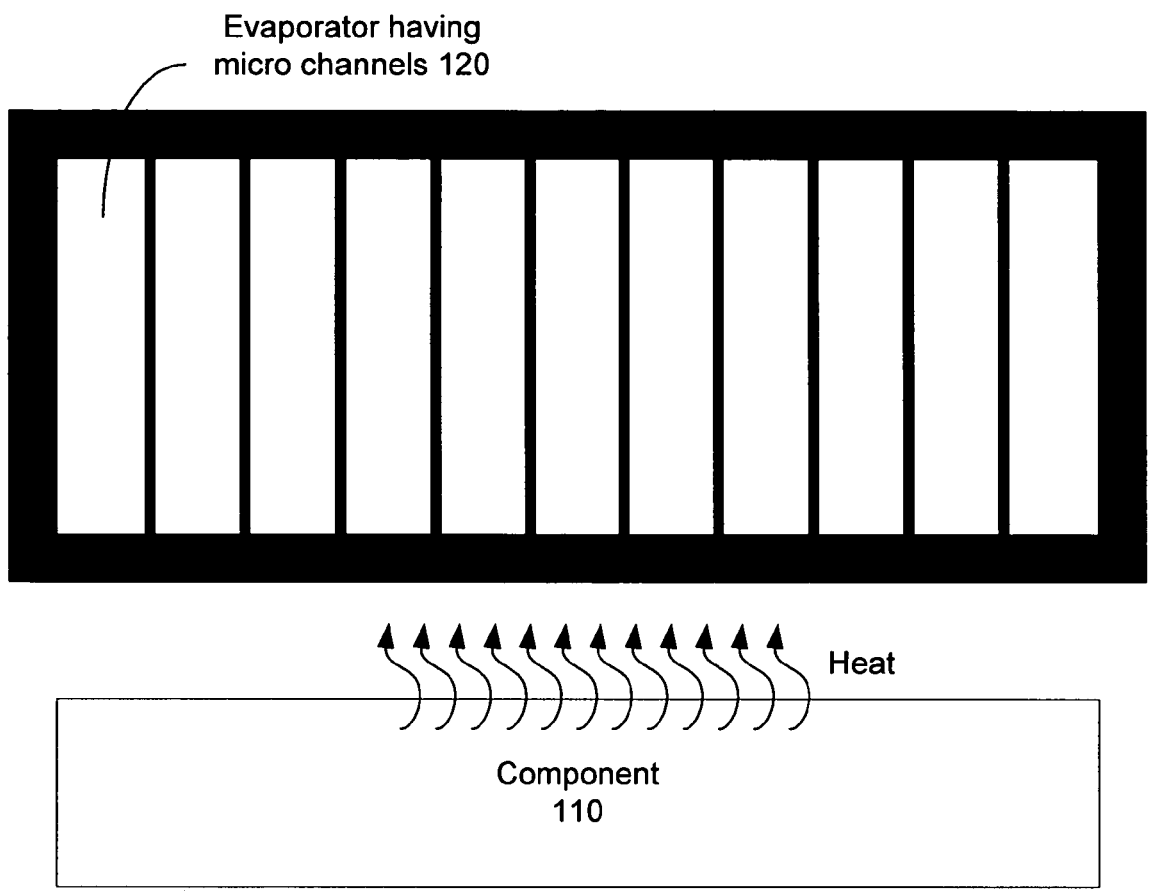
FIG. 1 is a prior art evaporator.
Figure 2A:
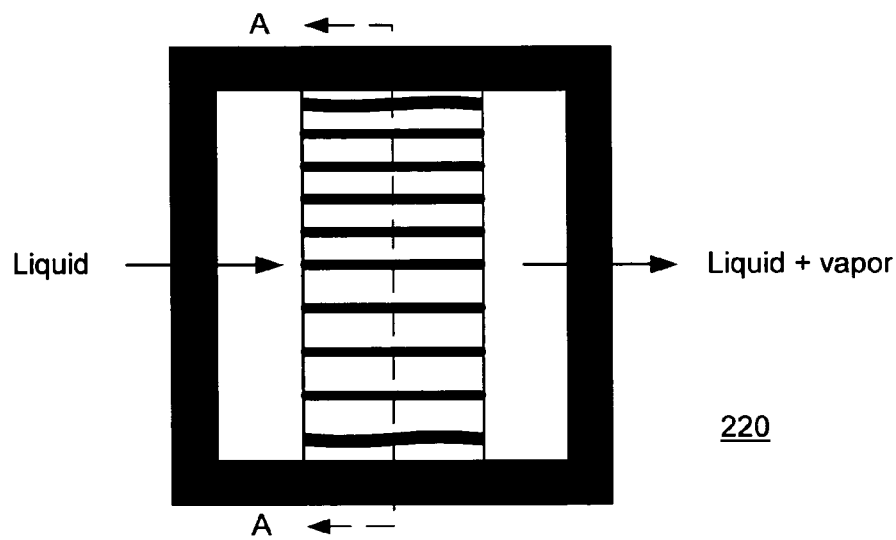
FIG. 2A is a top view of an embodiment of an evaporator comprising micro-channels having different channel widths.
Figure 2B:
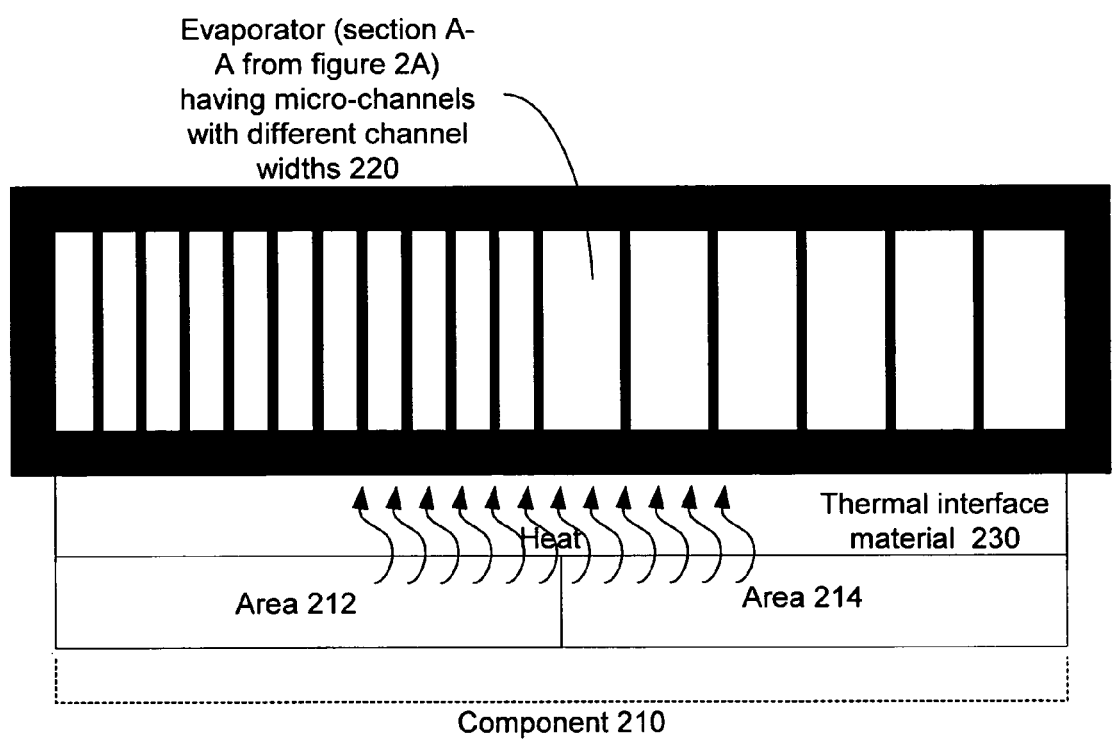
FIG. 2B is a cross-sectional view of an embodiment of an evaporator comprising micro-channels having different channel widths.

For an embodiment of the invention, an evaporator or cold plate comprising micro-channels having different channel widths is used with a component having a non-uniform heat distribution to maximize the pressure drop across the evaporator. The evaporator and its micro-channels may comprise copper or silicon. The channel widths may range from 50 microns to 1000 microns. An evaporator is depicted in FIGS. 2A and 2B. However, the same design may be used with a cold plate. FIG. 2A is a top view of the evaporator 220. FIG. 2B is a cross-sectional view of the evaporator 220. The evaporator 220 is thermally coupled to component 210. Component 210 comprises a first area 212 and a second area 214. The first area 212 and second area 214 may generate differing amounts of heat.

The channel widths of the evaporator 220 may be such that the channel widths are largest over the area of the component 210 that dissipates the most heat. Therefore, to provide evaporator 220 with better heat distribution, the channel widths over the second area 214 may be greater than the channel widths over the first area 212 if the second area 214 generates more heat than the first area 212 to improve the heat flow between channels. On the other hand, the channel widths over the first area 212 may be greater than the channel widths over the second area 214 if the first area 212 generates more heat than the second area 214. Matching the channel width to the heat generated under the channels helps in reducing flow maldistribution in the channels.

To minimize the thermal interface resistance between component 210 and evaporator 220, a thermal interface material 230 may be coupled between component 210 and evaporator 220. The thermal interface material 230 may comprise thermal grease, polymer, or metallic alloys.

Figure 11:
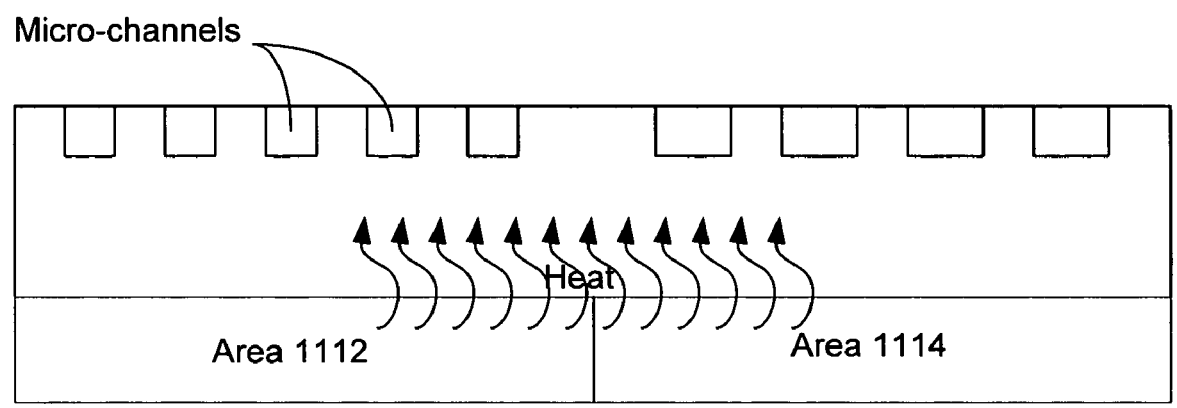
FIG. 11 is an embodiment of a silicon die comprising micro-channels having different channel widths.

For another embodiment of the invention, the micro-channels are built into the die itself rather than on a discrete evaporator or cold plate as depicted in FIG. 2B. FIG. 11 depicts channels that are integrated into the backside of a die. The die may comprise areas 1112 and 1114. The area 1114 may have a higher temperature than the area 1112. In order to reduce flow maldistribution in the channels, the channels of the die are positioned such that the channel widths over area 1114 are greater than the channel widths over area 1112.

For the embodiment of the invention depicted in FIG. 2A, the working fluid enters through the left side of the evaporator 220 and exits through the right side of the evaporator 220. The working fluid may comprise water, super critical carbon dioxide, Freon, ammonia, methanol, acetone, ethanol, or heptane. For another embodiment of the invention, the evaporator or cold plate of FIG. 3 directs the path of the working fluid to gradually warm the working fluid by thermally coupling the working fluid to the hottest portion of a component last.

Figure 3:
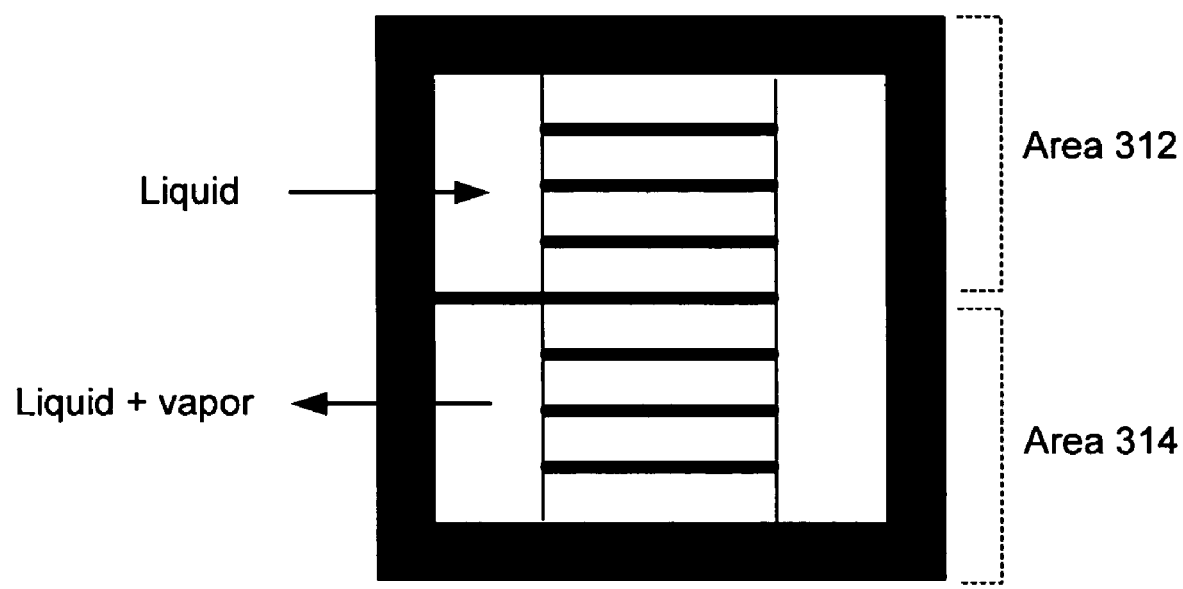
FIG. 3 is an embodiment of an evaporator that directs the path of the working fluid to gradually warm the working fluid.

FIG. 3 depicts a top view of evaporator 320. Evaporator 320 is thermally coupled to a heat generating component. A heat generating component may be disposed adjacent to the evaporator 320. The component comprises a first area 312 and a second area 314. The second area 314 may generate more heat than the first area 312. As a result, the evaporator 320 directs the working fluid first to area 312 prior to reaching the area 314. This working fluid flow pattern allows a gradual increase in working fluid temperature, which helps to remove subcooling and to enable two-phase cooling over area 314. For another embodiment of this invention, the flow pattern as described in FIG. 3 may be integrated into the backside of a silicon die.

Moreover, the channel widths of the evaporator 320 over component area 314 may be larger than the channel widths over component 312. As discussed above, the larger channel widths over the hotter component areas help to improve the heat flow to the working fluid.

Figure 4A:
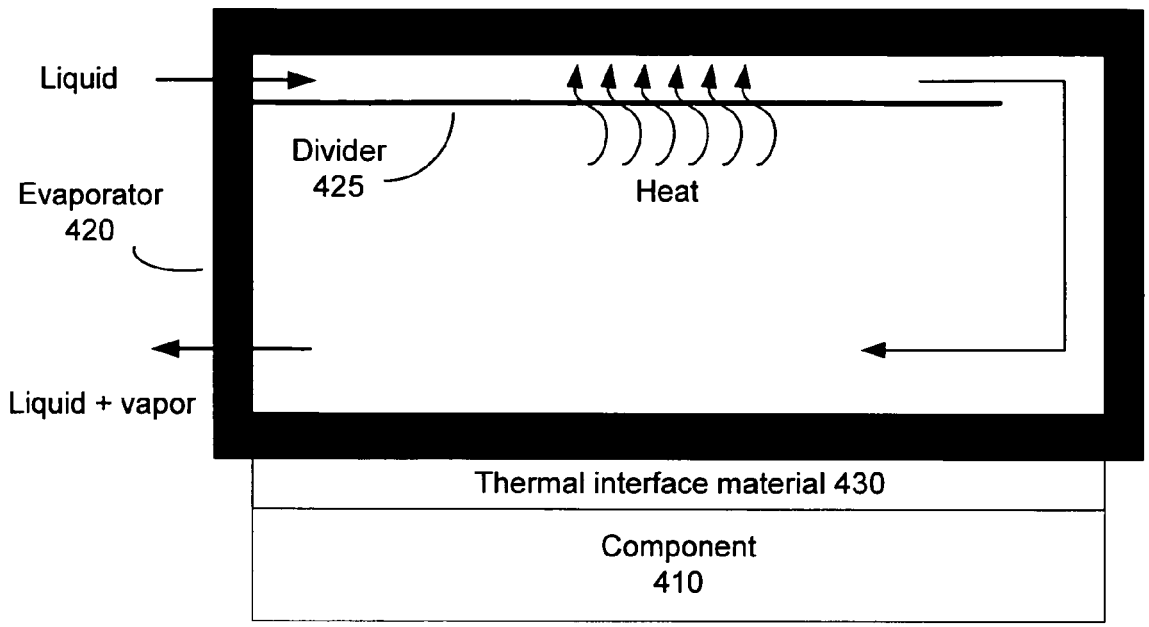
FIG. 4A is a side view of an embodiment of an evaporator that gradually warms the working fluid to improve the heat flow to the working fluid.
Figure 4B:
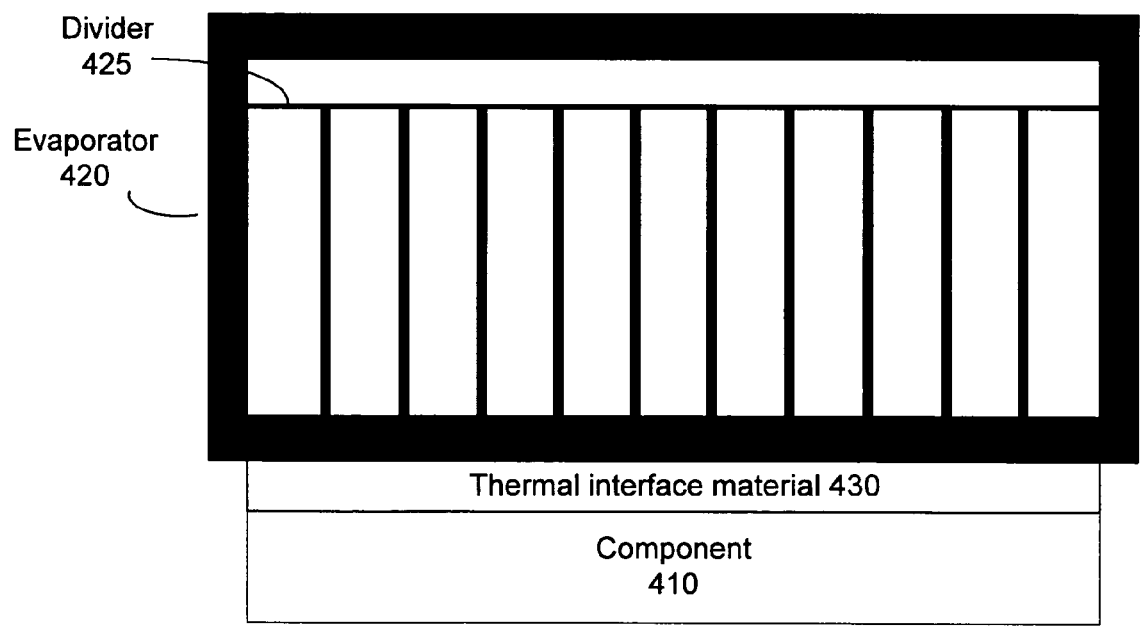
FIG. 4B is the cross-sectional view of an embodiment of an evaporator that gradually warms the working fluid to improve the heat flow to the working fluid.

FIGS. 4A and 4B depict yet another embodiment of the invention. Similar to evaporator 320, evaporator 420 gradually warms the working fluid to improve the heat flow to the working fluid. FIG. 4A shows the side view of evaporator 420. FIG. 4B shows the front view of evaporator 420. Evaporator 420 comprises a divider 425 that separates the evaporator 420 into a top portion and a bottom portion. A thermal interface material 430 is coupled to the evaporator 420. A component 410 that generates heat is coupled to the thermal interface material 430. The thermal interface material 430 may be used to reduce the thermal interface resistance between the component 410 and the evaporator 420.

Liquid may enter the evaporator 420 through the top portion. Because the bottom portion is physically closer to the component 410, the working fluid in the bottom portion may have a higher temperature than the working fluid in the top portion. Since heat rises, heat travels from the bottom portion to the top portion. Hence, the top portion pre-heats the fluid and eliminates or reduces subcooling such that the fluid reaches its saturation temperature as it reaches the die. This helps to ensure boiling heat transfer throughout the length of the die.

The divider 425 may comprise copper or silicon. The conductive properties of divider 425 help the top portion of the evaporator 420 capture heat from the bottom portion. As a result, the working fluid is gradually heated as it flows from the top portion to the bottom portion.

For yet another embodiment of the invention, the channel widths of the evaporator 420 may vary. For example, if component 410 comprises thermal gradients across its surface area, the channel widths over the hotter areas may be larger to improve heat flow to the working fluid.

Figure 5:
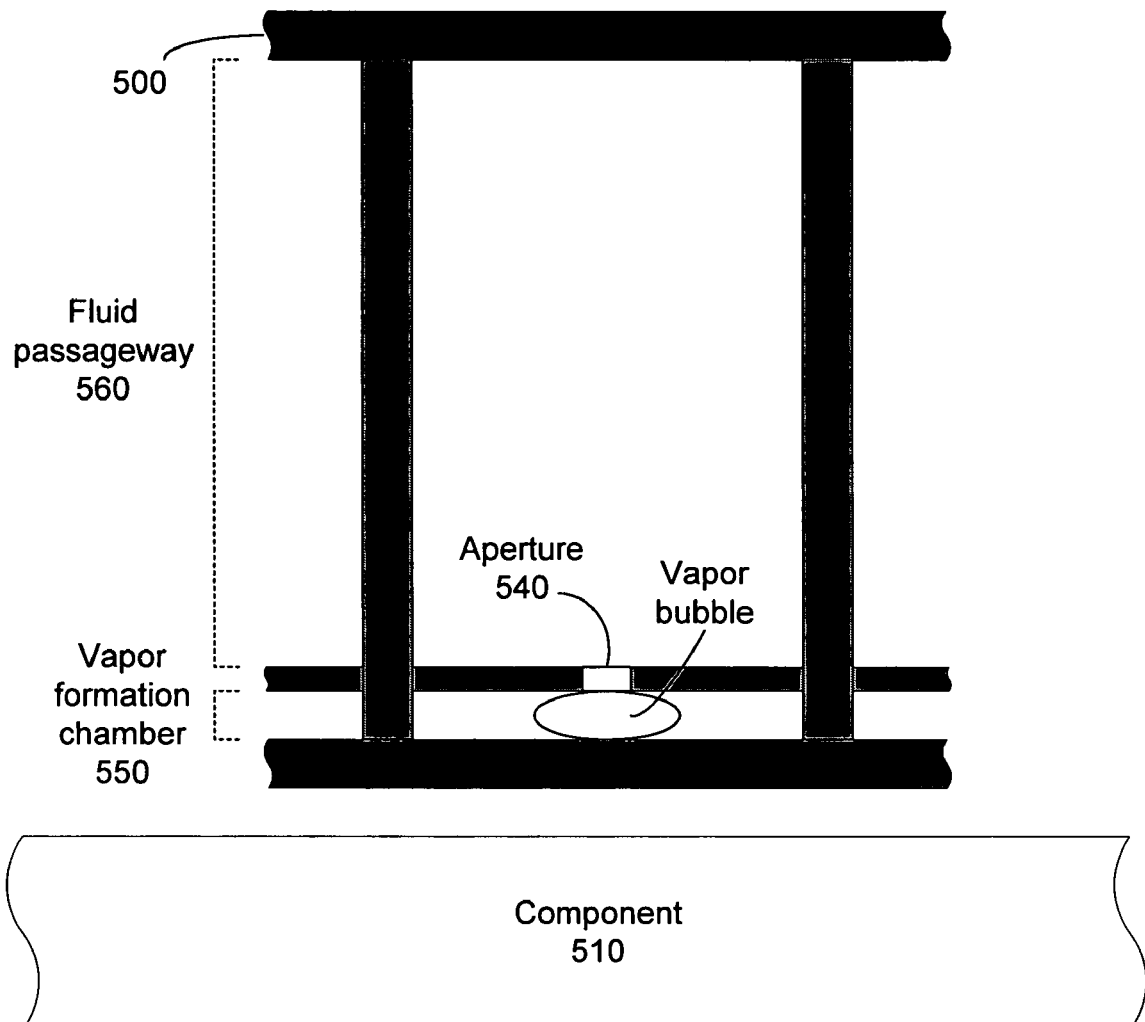
FIG. 5 is an embodiment of an evaporator micro-channel having an aperture.

To further increase heat transfer, the micro-channels of the embodiments of the evaporators or cold plates described above may comprise apertures. FIG. 5 depicts an example of such a micro-channel 500. The micro-channel 500 has an aperture 540. A vapor formation chamber 550 and a fluid passageway 560 are coupled to the aperture 540. The fluid passageway 560 is coupled to inlet and outlet plenums that transport working fluid.

A component 510 is coupled to the micro-channel 500. Heat from the component 510 causes vapors to generate in the vapor formation chamber 550. The vapors form bubbles in the fluid passageway 560. The aperture 540 provides a nucleation site in the evaporator. A nucleation site provides an area in the evaporator for vapors to form.

The evaporator or cold plate may comprise a plurality of micro-channels. Each of the micro-channels may comprise apertures. The apertures provide nucleation sites in the evaporator. Vapor bubbles are typically randomly generated within a fluid passageway. The apertures control where the vapors are introduced within the micro-channels. The apertures allow for an even distribution of vapor bubbles throughout the evaporator and increase nucleation site density in micro-channels. As a result, the boiling heat transfer is increased.

Figure 6:
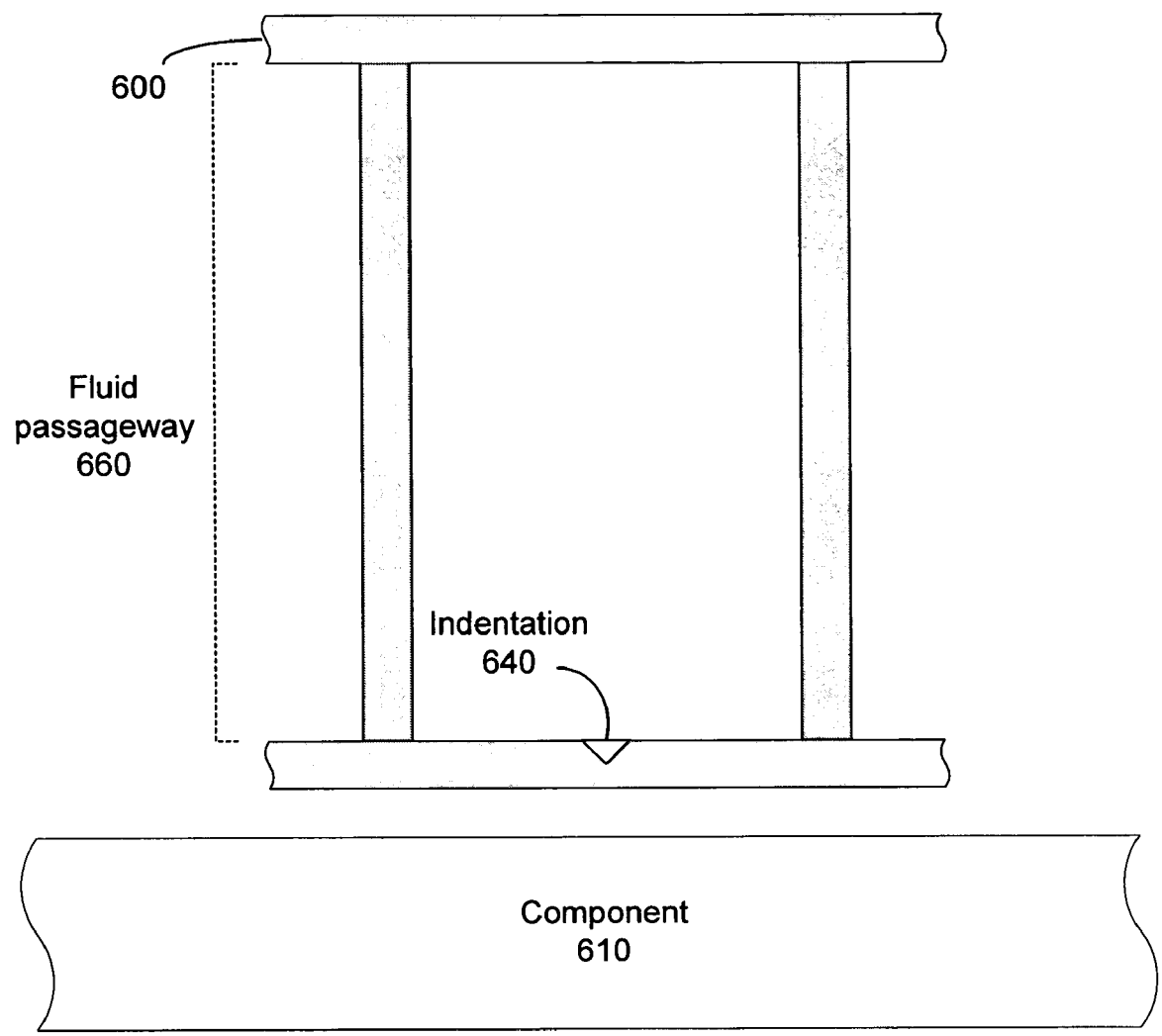
FIG. 6 is an embodiment of an evaporator micro-channel having an indentation.

For yet another embodiment of the invention, the micro-channels of an evaporator or a cold plate may comprise indentations instead of apertures to further improve heat transfer. FIG. 6 depicts a micro-channel 600 comprising an indentation 640 on the floor surface of the micro-channel 600. The indentation 640 is coupled to a fluid passageway 660. Heat generated by the component 610 is transferred to the working fluid of the evaporator. Vapor bubbles form in the working fluid as a result of the heat. The indentation 640 provides a nucleation site for vapor bubbles to form.

The evaporator may comprise a plurality of micro-channels. Each of the micro-channels may comprise indentations. The indentations may be positioned in a pattern in the micro-channels. The indentations may increase nucleation site density in micro-channels. As a result, the boiling heat transfer may be increased.

Figure 7:
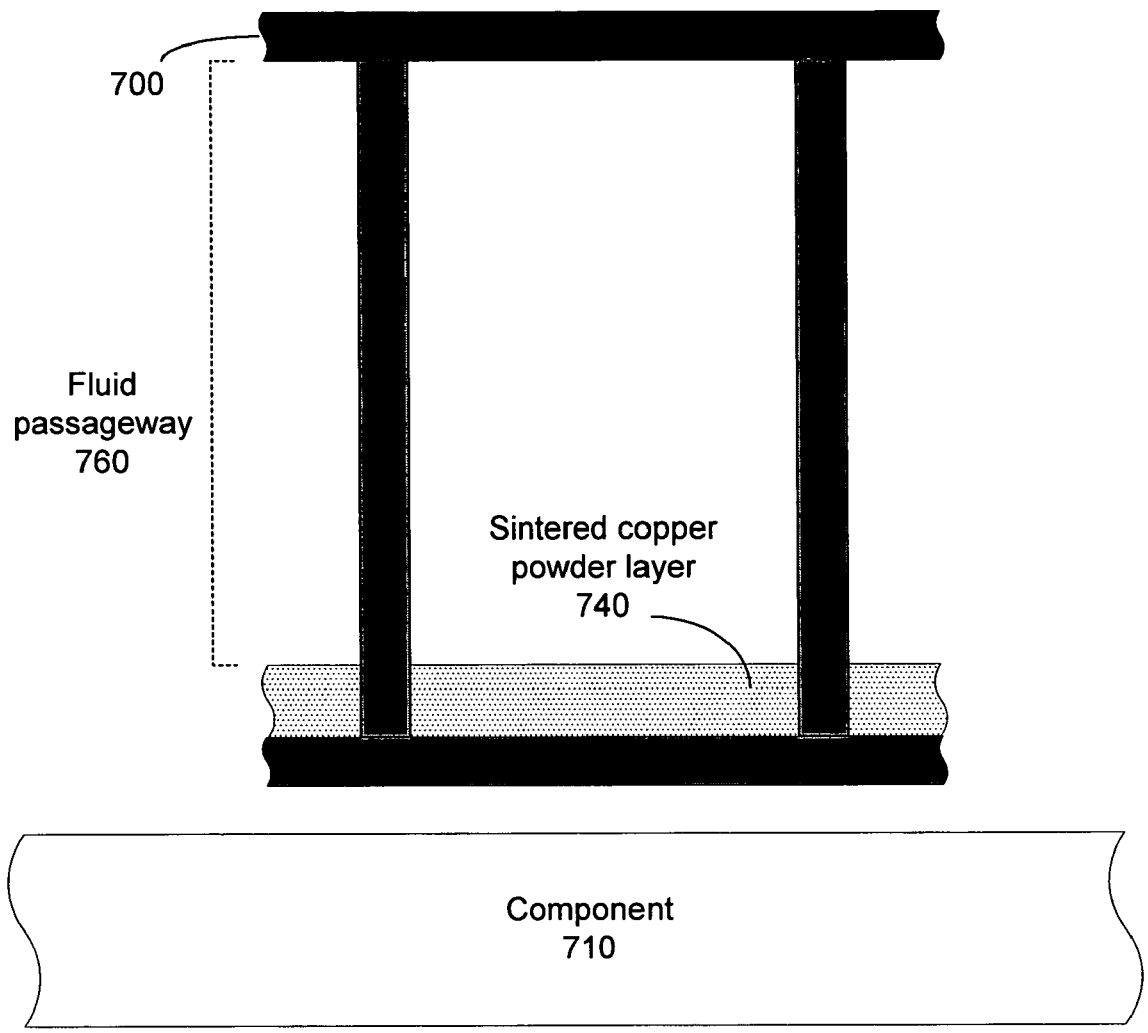
FIG. 7 is an embodiment of an evaporator micro-channel having a sintered copper powder layer.

For yet another embodiment of the invention, the micro-channels of an evaporator or cold plate may comprise a horizontal sintered copper powder layer to further improve heat transfer. FIG. 7 depicts a micro-channel 700 comprising a sintered copper powder layer 740. The sintered copper powder layer 740 is coupled to a fluid passageway 760. The fluid passageway 760 may be coupled to inlet or outlet plenums that transport working fluid. The micro-channel 700 is coupled to a component 710.

The evaporator may comprise a plurality of micro-channels. Each of the micro-channels may comprise a sintered copper powder layer. The sintered copper powder layer may provide nucleation sites for the evaporator. As heat is transferred to the evaporator, vapors are formed in the working fluid. The sintered copper powder layer increase nucleation site density in the plurality of micro-channels, improving boiling heat transfer.

Figure 8:
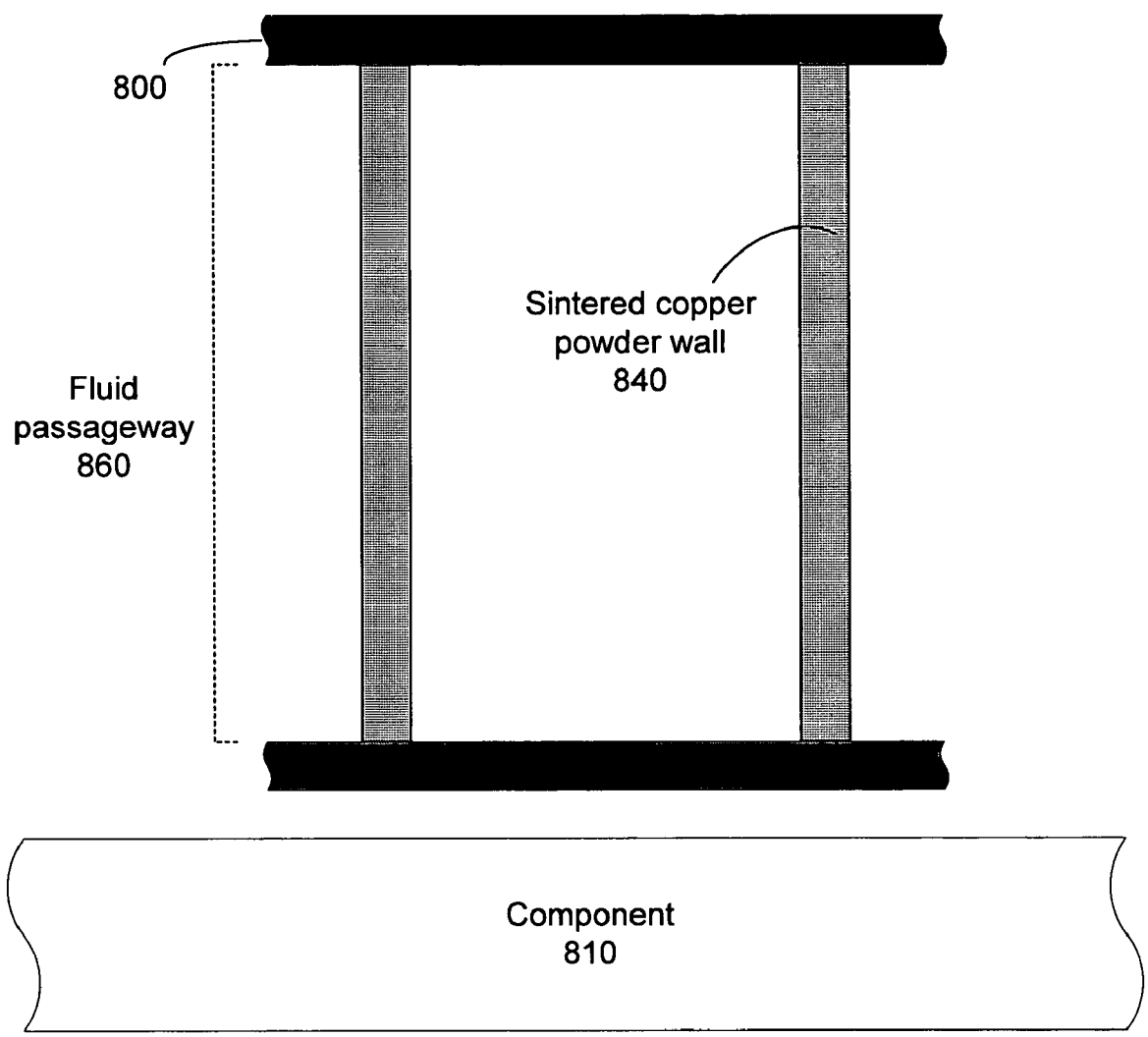
FIG. 8 is an embodiment of an evaporator micro-channel having a sintered copper powder wall.

For yet another embodiment of the invention, the micro-channels may comprise vertical sintered copper powder walls to further improve heat transfer. FIG. 8 depicts a micro-channel 800 having a sintered copper powder wall 840. The sintered copper powder wall 840 is coupled to a fluid passageway 860. The micro-channel is coupled to a component 810.

The sintered copper powder wall 840 provides nucleation sites for vapor bubbles created by heat transferred from the component 810. By introducing sintered copper powder walls throughout the evaporator, the nucleation sites provide equal pressurization across the evaporator and improved nucleation site density. As a result, boiling heat transfer is increased.

Figure 9:
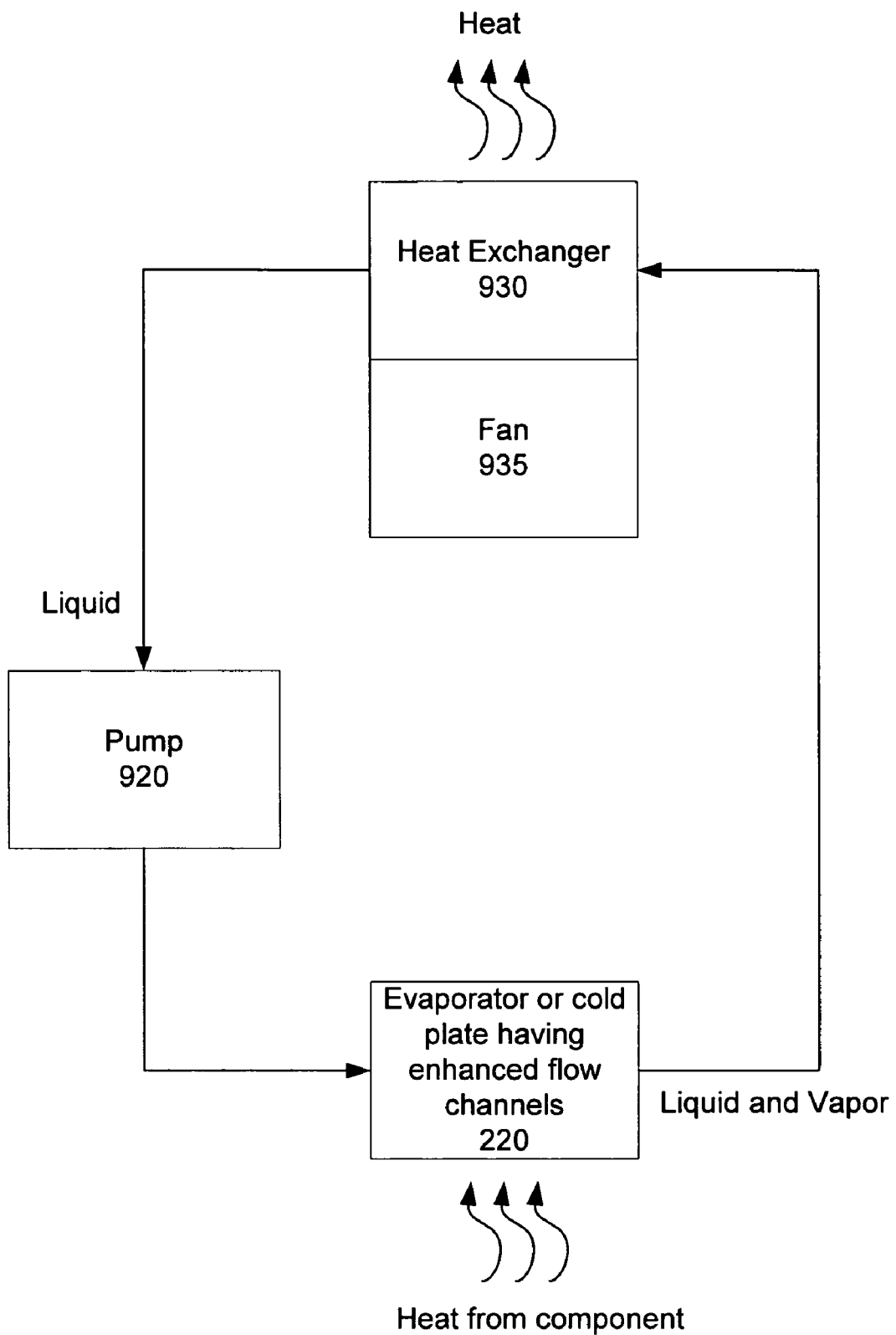
FIG. 9 is an embodiment of a two-phase cooling system loop comprising an evaporator having an enhanced flow channel design.

FIG. 9 is an embodiment of a two-phase cooling loop comprising an evaporator 220 that has an enhanced flow channel design of micro-channels. Evaporator 220 is coupled to heat exchanger 930. Heat exchanger 930 is coupled to fan 935 and pump 920. Pump 920 is coupled to evaporator 220.

The evaporator 220 transfers heat from a heat generating component to a working fluid. The component may have a first area and a second area. The first area may generate more heat than the second area. For example, the component may be a CPU comprising a core area and a cache area. The core area may generate more heat than the cache area. The evaporator 220 comprises micro-channels having different channel widths. Larger channel widths are used over the core area in order to minimize the pressure drop across the evaporator. The heat from the component causes the working fluid to change from a liquid phase to a liquid and a vapor phase. The working fluid is cooled in the heat exchanger 930 by fan 935. The pump 920 returns the working fluid to evaporator 220 to complete the loop.

For another embodiment of the invention, the evaporator 320 may be used instead of the evaporator 220 in the two-phase cooling loop of FIG. 9. For yet another embodiment of the invention, the evaporator 420 may be used instead of the evaporator 220 in the two-phase cooling loop of FIG. 9.

Figure 10:
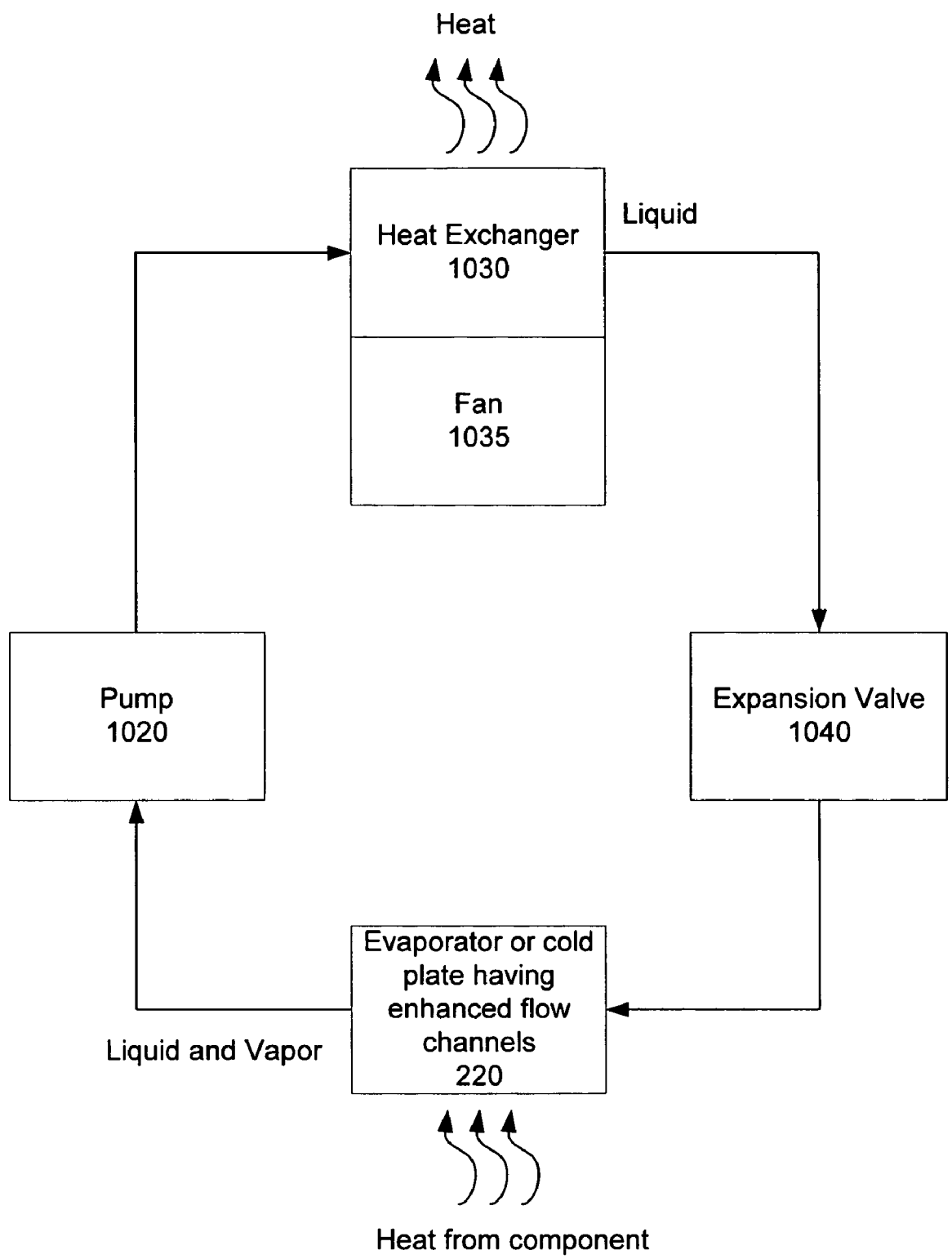
FIG. 10 is an embodiment of a refrigeration cooling system loop comprising an evaporator having an enhanced flow channel design.

FIG. 10 depicts a refrigeration loop comprising an evaporator 220 that has an enhanced flow channel design of micro-channels. Evaporator 220 is coupled to pump 1020. Pump 1020 is coupled to heat exchanger 1030. Heat exchanger 1030 is coupled to fan 1035 and expansion valve 1040. Expansion valve 1040 is coupled to evaporator 220.

The evaporator 220 transfers heat from a heat generating component to a working fluid. The component may be a CPU comprising a core area and a cache area. The core area may generate more heat than the cache area. The evaporator 220 comprises micro-channels having different channel widths. Larger channel widths are used over the core area in order to maximize the pressure drop across the evaporator. The heat from the component causes the working fluid to change from a liquid phase to a liquid and a vapor phase.

The pump 1020 transfers the working fluid to heat exchanger 1030. The heat exchanger 1030 may cool the working fluid using fan 1035. Expansion valve 1040 reduces the pressure of the working fluid before the working fluid returns to the evaporator 220.

For another embodiment of the invention, the evaporator 220 of FIG. 10 may be replaced by evaporator 320 or evaporator 420. Evaporator 320 and evaporator 420 were described above in FIG. 3 and FIG. 4 respectively.

For yet another embodiment of the invention, evaporators 220, 320, or 420 may be used in a single-phase loop. For example, evaporator 220 may use a liquid to absorb and remove heat from a component of a computer system. The liquid may then be circulated to an area of the system where heat is passively purged through natural convection.

In the foregoing specification the invention has been described with reference to specific exemplary embodiments thereof. It will, however, be evident that various modification and changes may be made thereto without departure from the broader spirit and scope of the invention as set forth in the appended claims. The specification and drawings are, accordingly, to be regarded in an illustrative rather than restrictive sense.

What is claimed is:

1. A thermal management system, comprising:
   a heat generating component that comprises a first area and a second area, wherein the first component area generates more heat than the second component area; and
   an evaporator thermally coupled to the heat generation component to transfer the heat from the component to a working fluid, wherein the evaporator comprises a plurality of micro-channels to provide fluid paths from the component, wherein the micro-channels have a first channel width and a second channel width, wherein the micro-channels having a first channel width are disposed adjacent to the first component area and the micro-channels having a second channel width are disposed adjacent to the second component area, wherein the first channel width is different from the second channel width,
   wherein the evaporator is divided into a top portion and a bottom portion, wherein the working fluid is warmed in the top portion before reaching the bottom portion.

2. The thermal management system of claim 1, further comprising:
   a heat exchanger coupled to the evaporator to remove heat from the working fluid; and
   a pump coupled to the heat exchanger to transfer the working fluid to the evaporator.

3. The thermal management system of claim 1, further comprising:
   a thermal interface material coupled to the component and the evaporator, wherein the thermal interface material reduces a thermal interface resistance between the component and the evaporator.

4. The thermal management system of claim 1, wherein the working fluid comprises water, super critical carbon dioxide, Freon, ammonia, methanol, acetone, ethanol, or heptane.

5. The thermal management system of claim 1, wherein the component is a central processing unit, wherein the first component area is a processor and the second component area is a cache.

6. The thermal management system of claim 1, wherein the first channel width is greater than the second channel width.

7. The thermal management system of claim 1, wherein the working fluid is thermally coupled to the second component area before being thermally coupled to the first component area.

8. The thermal management system of claim 1, wherein apertures provide nucleation sites in the plurality of micro-channels.

9. The thermal management system of claim 1, wherein indentations provide nucleation sites in the plurality of micro-channels.

10. The thermal management system of claim 1, wherein a horizontal sintered copper powder layer provide nucleation sites in the plurality of micro-channels.

11. The thermal management system of claim 1, wherein vertical sintered copper powder walls provide nucleation sites in the plurality of micro-channels.

12. A thermal management system, comprising:
   means for providing heat transfer in micro-channels of an evaporator that is thermally coupled to component having a first temperature area and a second temperature area, said means divided into a top portion and a bottom portion, wherein a working fluid is warmed in the top portion before reaching the bottom portion; and
   means for increasing nucleation site density in the micro-channels.

13. The thermal management system of claim 12, further comprising:
   means for transferring the working fluid from the first temperature area to the second temperature area.

14. The thermal management system of claim 12, comprising:
   means for gradually warming the working fluid.

15. A method, comprising:
   transferring heat from a heat generating component to an evaporator, wherein the heat generating component has a first temperature area that is not equal to second temperature area, wherein heat is transferred from the first temperature area through a first plurality of flow channels, wherein heat is transferred from the second temperature area through a second plurality of flow channels, wherein the first plurality of flow channels are wider than the second plurality of flow channels;
   warming up the working fluid in a top portion of the evaporator; and
   generating vapors through a plurality of nucleation sites.

16. The method of claim 15, further comprising:
   warming up the working fluid over the second temperature area before the working fluid is thermally coupled to the first temperature area.

17. The method of claim 15, further comprising:
   transferring the working fluid to a bottom portion of the evaporator.

18. A silicon die, comprising:
   a processor core;
   a cache coupled to the processor core;
   a first plurality of channels positioned over the processor core to provide a flow path for the heat generated by the processor core; and
   a second plurality of channels positioned over the processor cache to provide a flow path for the heat generated by the cache, wherein the first plurality of channels have different widths than the second plurality of channels,
   wherein the first plurality of channels and the second plurality of channels are each divided into a top portion and a bottom portion, wherein a working fluid is warmed in the top portion before reaching the bottom portion.

19. The silicon die of claim 18, wherein the widths of the first plurality of channels are greater than the widths of the second plurality of channels.

* * * * *